United States Patent [19]

Chaudhari et al.

[11] 4,293,374
[45] Oct. 6, 1981

[54] HIGH ASPECT RATIO, HIGH RESOLUTION MASK FABRICATION

[75] Inventors: Praveen Chaudhari, Briarcliff Manor; Ned J. Chou, Yorktown Heights; Ralph Feder, Hyde Park; Alan B. Fowler, Yorktown Heights; James A. VanVechten, Ossining, all of N.Y.

[73] Assignee: International Business Machines Corporation, Armonk, N.Y.

[21] Appl. No.: 128,710

[22] Filed: Mar. 10, 1980

[51] Int. Cl.[3] ............ B44C 1/22; C03C 15/00; C03C 25/06; H01L 21/425
[52] U.S. Cl. .................. 156/628; 156/630; 156/633; 156/643; 156/644; 156/657; 156/659.1; 156/667; 156/606; 430/296; 430/323; 427/85
[58] Field of Search .......... 156/628, 630, 633, 643, 156/644, 650, 651, 654, 655, 657, 659.1, 663, 667; 148/1.5, 187

[56] References Cited

U.S. PATENT DOCUMENTS

| | | | |
|---|---|---|---|
| 3,303,085 | 2/1967 | Price et al. | 156/644 X |
| 3,415,993 | 12/1968 | Fleischer et al. | 156/644 X |
| 3,520,741 | 7/1970 | Mankarious | 148/175 |
| 3,852,134 | 12/1974 | Bean | 156/644 X |
| 4,013,502 | 3/1977 | Staples | 156/608 |
| 4,021,276 | 5/1977 | Cho et al. | 156/644 |

OTHER PUBLICATIONS

Electrical Engineering in Japan, vol. 95, No. 6, Nov.--Dec. 1975, Molecular Beam Epitaxy with Ionized Dopant by N. Matsunaga et al., pp. 28-32.

*Primary Examiner*—William A. Powell
*Attorney, Agent, or Firm*—E. Ronald Coffman

[57] ABSTRACT

A high aspect ratio collimating mask for use in ion beam epitaxy or ion implantation doping is formed through the use of damage-trail-forming materials which are irradiated through a mask and then etched. The high aspect ratio is obtained in part by the sequential formation of a plurality of spaced mask plates. The mask is useful in producing large scale integrated circuits by ion implantation during epitaxial growth of a crystal wafer.

6 Claims, 10 Drawing Figures

HIGH ASPECT RATIO, HIGH RESOLUTION MASK FABRICATION

This invention relates to the production of complex integrated circuits by ion beam implantation during epitaxial crystal growth. The invention eliminates the use of masking, etching and other intermediate processes performed outside the crystal growth chamber itself, which intermediate processes are expensive, time-consuming and otherwise undesirable.

The implantation of a growing crystal with uniformly distributed doped layers is known, as is the use of a raster-controlled ion beam, for producing patterns of doped regions in the crystal during its growth. Practical considerations of required scan time with respect to crystal growth rate limit the complexity of circuit arrays that can be produced with known techniques. For example, complex integrated circuits having a million different devices on a single semiconductor wafer cannot be practically formed with a single scanning ion beam.

An object of our invention has been to provide apparatus capable of generating a large number, e.g., one million, of accurately defined co-parallel ion beams which can be controlled simultaneously by electrostatic deflection plates to form doped patterns in an epitaxial growing layer.

Another object of our invention has been to provide an ion beam mask having a high aspect ratio in the order of $10^5$–$10^6$ that is capable of producing such a plurality of co-parallel ion beams.

A further object of our invention has been to provide a method of producing such a high aspect ratio mask.

In accordance with our invention, a high aspect ratio mask is interposed between an ion source and a wafer undergoing epitaxial growth, such that a large number of individual ion beams deposit doping ions in the growing wafer material in regions which can be displaced as required to produce a multitude of semiconductor devices. A mask, in accordance with our invention, comprises two or more spaced wafers, each having holes with an aspect ratio in the order of $10^2$ for the passage of an ion beam. The wafers are spaced to provide the overall aspect ratio of $10^5$. Moreover, by selecting a high-intensity, small dispersion ion source such as the presently available liquid metal ion sources, which generate beams having minimum thermal energy, performance equivalent to an aspect ratio of $10^6$ can be realized. When more than two wafers are employed, the spacing between them should be irregular to reduce the possibility of interference between neighboring holes.

The mask of our invention is produced through the use of materials such as $Al_2O_3$ including sapphire, mica, garnet and $SiO_2$ including quartz which are known to be damage trail forming materials since high energy ions passing therethrough leave a perceptible trail along their passage. A discussion of the nature and identification of trail forming materials is found in "Nuclear Tracts in Solids Principles and Applications" by Robert L. Fleisher, P. Buford Price and Robert M. Wachor (University of California Press, Berkley, Calif., 1975).

A first or primary wafer is prepared with a layer of an appropriate heavy metal such as gold, formed by any of several known processes to mask those regions of the wafer where openings are not desired. The wafer is then irradiated with high energy particles which pass through the unmasked regions of the wafer without deflection. The damage trails thus formed are etched to produce holes having aspect ratio in the order of $10^2$. A second wafer, similar to the first but without the metal mask, is rigidly mounted onto the primary wafer, parallel thereto, and spaced the desired distance required to produce the desired aspect ratio. This second wafer is next irradiated with high energy ions through the openings provided in the primary wafer. Damage trails are thereby formed in the second wafer. These damage trails etched, as previously done with the primary wafer, to provide openings of an aspect ratio in the order of $10^2$ in that wafer. The aspect ratio for the two wafer system is now much greater due to the spacing between wafers. Additional wafers can be added and formed in a similar manner to enhance the final mask.

With the high aspect ratio mask thus formed, a doping ion beam can be divided into a large number of co-parallel, distinct beams for doping selected areas of a wafer undergoing epitaxial growth. These beams can be electrostatically deflected to control the shape, size and location of the regions being doped. Of course, all of the usual adjunctive processes can be used as well, including the provision of an additional ion source for controlling the general doping level of the layers being grown, alternate ion sources for providing differently polarized regions and a focused ion beam source for writing metalized conductive lines on a device after epitaxial growth has been completed.

These and other objects, features and advantages of our invention will be apparent to those skilled in the art from reading and understanding the following more particular description of a preferred embodiment wherein reference is made to the accompanying drawings, of which:

Figure 1:
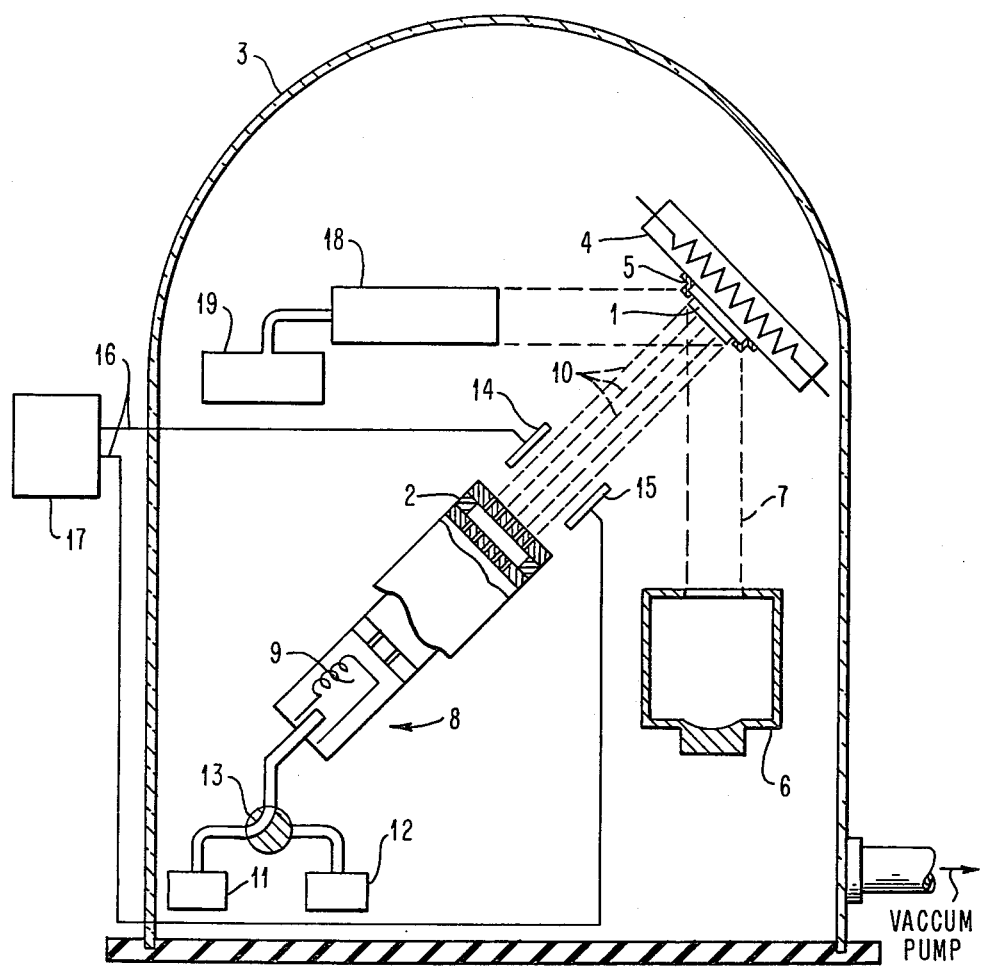
FIG. 1 is a simplified view of an epitaxial growth chamber including an ion source for selectively incorporating doping ions during epitaxial growth.

FIG. 1 shows equipment for performing ion beam epitaxial growth of a wafer 1, while implanting localized dopants in a large number of closely spaced regions of the wafer through use of a high aspect ratio collimating mask 2, constructed in accordance with our invention. The equipment in FIG. 1 includes a vacuum chamber 3 in which is mounted a heated sample holder 4 onto which a ring 5 clamps the crystal base for the wafer 1. An electron beam source 6 produces a focused stream 7 of ions and atoms of the basic material of which the crystal wafer is to be grown. For example, the material supplied by electron gun 6 can be silicon.

A high-intensity ion source 8 includes an ionization chamber 9 wherein a doping material such as arsenic, phosphorus, boron or gallium is ionized by a strong electrostatic field and the resultant ions are selectively focused and accelerated electromagnetically within the ion source 8 toward the wafer 1. The collimating mask 2 of our invention divides the accelerated ion beam into a plurality of highly collimated discrete beams 10 which will dope localized areas of the wafer 1 being grown. Alternate sources of ionizing material 11 and 12 can be selectively connected via valve 13 to the gas inlet into ionizing chamber 9. It may be preferable to employ an electromagnetic field to select the desired ions in accordance with the principle of a mass spectrograph instead of the valved arrangement shown. Material supply source 11, for example, can include arsenic which, as a dopant to silicon, provides an N-type semiconductor material, whereas the material source 12 can include gallium which, in a silicon wafer, produces a P-type semiconductor material.

A pair of deflection electrodes 14 and 15 are positioned adjacent the path of parallel beams 10 and are electrically connected via wires 16 to a voltage control source 17. Source 17 controls the electrostatic field between plates 14 and 15 to control the path of the ion beams in unison, such that the ion beams can be moved across the surface of the wafer 1 being grown.

In addition, the equipment shown in FIG. 1 includes a further high-intensity ion source 18 which can be similar to the ion source 8 but without including a multi-aperture collimating mask as previously described. The purpose of ion source 18 is to provide, where desired, an overall doping of the silicon wafer 1 to provide a background or general composition. Typically, only a single material supply 19 would be required and the material would be selected in accordance with whether the background of the wafer material was to be an N- or a P-type semiconductor material.

Figure 2:
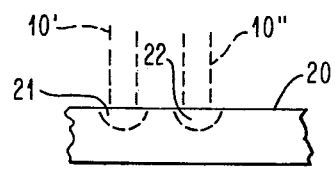
FIG. 2 is an enlarged cross-sectional view of a field-effect-transistor formed in a semiconductive layer in accordance with our invention.
Figure 3:
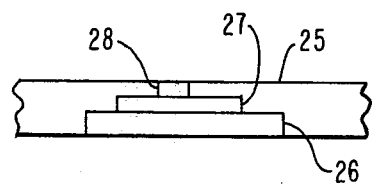
FIG. 3 is an enlarged cross-sectional view of a bipolar transistor formed in a semiconductive layer in accordance with our invention.

FIGS. 2 and 3 show typical semiconductor devices which are produced by equipment like that shown in FIG. 1 with appropriate controls applied. FIG. 2 shows a field-effect-transistor consisting of a base crystal 20 grown epitaxially in chamber 3 from a silicon electron beam source 6, and simultaneous P-type doping with gallium from high-intensity ion beam source 18. The field-effect-transistor is provided by creating separate but closely adjacent regions 21 and 22 of N-type semiconductor material by doping with arsenic, for example, during the epitaxial growth. This can be accomplished in our invention in either of two ways. The collimating mask 2 can be provided with a hole pattern such that one ion beam 10' is provided to form region 21 and a second beam 10" is provided to form region 22. Alternatively, the collimating mask can be configured to provide a single ion beam 10 for the formation of the entire field-effect transistor of FIG. 2. This is accomplished by applying a series of deflecting pulses by control 17 to deflection plates 14 and 15 whereby the single beam 10 is repeatedly directed alternately onto regions 21 and 22, moving between position 10' and 10" during the epitaxial growth of the crystal. Where a large number of field-effect transistors are being simultaneously formed through use of our invention, each of the individual ion beams 10 would be deflected in a similar manner.

FIG. 3 shows a bi-polar transistor which can be formed, using the equipment of our invention. The transistor of FIG. 3 is formed in a crystal base 25 of intrinsic silicon material which has been formed by electron beam source 6 without background doping and has had formed therein three regions of superimposed doping of alternative polarity, namely a first region 26 of N-type semiconductor material, an intermediate region 27 of P-type semiconductor material, and an upper region 28 of N-type semiconductor material. The device shown in FIG. 3 is formed in the equipment of FIG. 1 by setting valve 13 to supply N-type dopant from material source 11 to ionization chamber 9 and supplying a sawtooth wave form to deflection plates 14 and 15 from control 17, such that a single beam 10 will traverse the elongated region 26, implanting N-type doping material therein during crystal growth. Alternatively the wafer 1 could be controllably moved to effect a relative movement in relation to the undeflected beams. Many techniques are well known for achieving this movement, such as a piezoelectric inch worm device. After a sufficient depth of the wafer has been achieved, valve 13 is switched to source 12 of P-type dopant material and the process is repeated but with the amplitude of the sawtooth wave supplied to deflection plates 14 and 15 reduced. This process is again continued until a sufficient depth has been obtained whereupon valve 13 is again switched back to connect to material source 11 and the device is completed by depositing the N-type material to form region 28. As in the case of FIG. 2, the deflection required will be applied to all of the beams 10, such that similar devices will be produced wherever a beam 10 is provided by the collimating mask 2.

Figure 4:
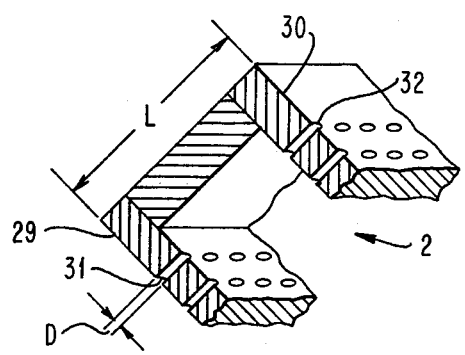
FIG. 4 is an enlarged fragmentary perspective view of a two wafer high aspect ratio mask constructed in accordance with our invention.

To produce a very large number of devices, e.g., one million, within a very small wafer, e.g., one-inch diameter, it is essential that the ion beams 10 be precisely and reliably defined. This is accomplished in our invention through the use of collimating mask 2 which has an effective aspect ratio in the order of $10^5$–$10^6$. That is to say, that the mask provides individual openings for the ion beam which are 100,000 times longer than their diameter. A fragment of the mask 2 is shown in perspective in FIG. 4, at a greatly enlarged scale, to better illustrate its components. The collimating mask includes a first or upstream plate 29 and a downstream plate 30 which have respective openings 31 and 32 coaxially arranged therein. A spacer plate 33 rigidly interconnects the plates 29 and 30 and provides the length required to achieve the high aspect ratio. Thus the effective aspect ratio of the mask 2, as shown in FIG. 4, is determined by the length L between the outer surfaces of plates 29 and 30, divided by the diameter D of the openings in the plates. For some applications, it may be preferable to employ more than two plates to further improve the accuracy of the mask. In such case, the varied, non-regular spacing between the plates should be provided to minimize interference by ions of neighboring beams.

We have invented a method of making the openings 31 and 32 very small, i.e. 100 nanometers, as is required to produce the object of our invention. Our method is illustrated by FIG. 5 and comprises the steps of first taking a wafer 34 of a known trail-forming material such as quartz, mica, $SiO_2$, $Al_2O_3$ etc. of a thickness, for example, 10 $\mu M$ of $Al_2O_3$ for ions of 1 MeV protons. We first form on one surface a preliminary mask 35 (FIG. 5A) that provides openings wherever ion beams 10 are to be desired. Preferably this mask 35 is formed in gold or platinum. Gold can be applied with the required precision in an electron gun deposition device. The mask is applied in sufficient thickness, e.g., 10 $\mu M$ to be an effective block to high-energy ions.

The wafer 34 is next subjected (FIG. 5B) to a beam 36 of high-energy ions which, in the unmasked regions, will penetrate the wafer and form relatively undeflected damage trails 37 therethrough. The wafer 34 is next subjected to an etching treatment (FIG. 5C), using, for example, for sapphire wafers, a 1:1 solution of phosphoric and sulphuric acids which attacks the wafer material and enlarges the trails 37 to a diameter of about 100 nanometers. The thus-formed wafer 34 becomes the upstream plate 29 of the mask 2.

The next step (FIG. 5D) is to assemble the thus-formed mask with the spacer plates 31 and a second wafer 38 of a trail-forming material. Again (FIG. 5E), the assembly is subjected to a beam 36 of high-energy ions which are blocked by the gold mask in all regions except the unmasked openings. Ions passing through the unmasked openings penetrate the second wafer 38 to form undeflected damage trails 40 therethrough.

Finally (FIG. 5F), the lower wafer of 38 is subjected to an etching as described above, and the trails 40 are enlarged to 100 nanometers with the lower wafer now forming the downstream plate 30 of the collimating mask. The gold mask is allowed to remain on the upstream plate 29 at a protection against ion penetration of the trail-forming material during use of the mask in the high intensity electron source 8 of FIG. 1.

Figure 5A:
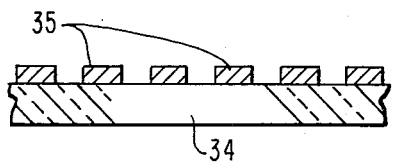
FIGS. 5A–5F are enlarged progressive views showing the process steps of the method by which a two wafer high aspect ratio mask of our invention is produced.
Figure 5B:
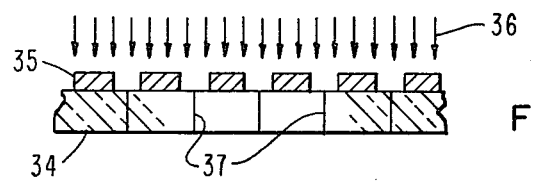
Figure 5C:
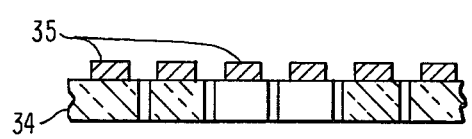
Figure 5D:
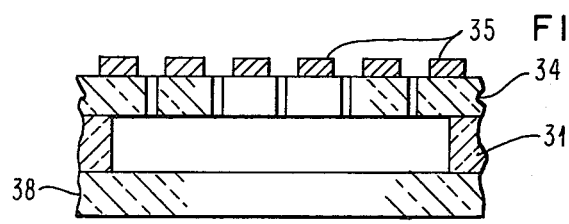
Figure 5E:
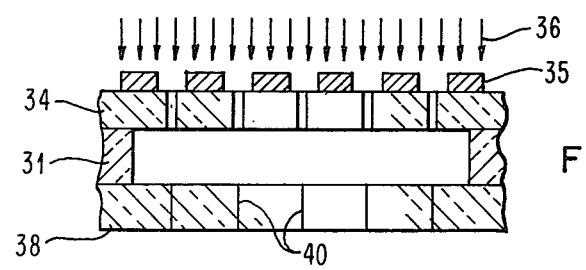
Figure 5F:
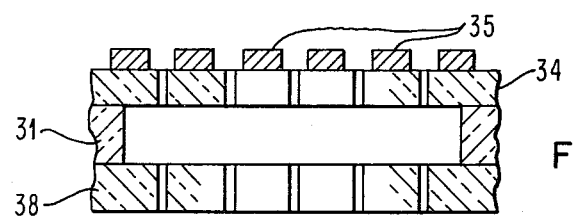

Additional wafers can be added to achieve the precision desired by repeating the steps shown in FIGS. 5E through 5F.

It should be understood by those skilled in the art that while the invention has been previously described in terms of a method of fabricating wafers by epitaxial growth, the inventive concepts would equally be applicable to methods utilizing ion implantation doping and annealing.

Having thus described our invention, what we claim as new, and desire to secure by Letters Patent is:

1. The process of making a high aspect ratio collimating mask comprising the step of:

forming on a first thin plate of damage-trail-forming material, a preliminary mask of particle-arresting material configured to leave unmasked regions where openings are to be formed, irradiating said first plate through said preliminary mask with particles having sufficient energy to pass through said first plate with negligible deflection and form damage trails therethrough, etching said first plate to enlarge said damage trails, mounting a second thin plate of damage-trail-forming material spaced from and superimposed with said first plate, irradiating said second plate through said preliminary mask and the enlarged damage trails in said first plate, with particles energized sufficiently to pass through said second plate with negligible deflection and form damage trails therethrough, and etching said second plate to enlarge said damage trails.

2. The process as defined in claim 1 wherein said damage-trail-forming material is selected from the group consisting of $Al_2O_3$, $SiO_2$, mica and garnet.

3. The process, as defined in claim 1, wherein said particle-arresting material comprises gold.

4. The process, as defined in claim 1, wherein said damage-trail-forming material is sapphire with the plates thereof having a thickness of about 10 microns, and wherein the energy of said irradiation is in the order of 1 MeV protons.

5. The process, as defined in claim 3, wherein said particle-arresting material comprises gold and said preliminary mask has a thickness of about 10 microns.

6. The process, as defined in claim 1, wherein said plates each have a thickness of about 10 microns, the openings therethrough are etched to about 100 nanometers, and the spacing therebetween is about 1 centimeter.

* * * * *